United States Patent
Wang et al.

(10) Patent No.: US 9,479,270 B2
(45) Date of Patent: Oct. 25, 2016

(54) APPARATUS AND METHODS FOR LOSS OF SIGNAL DETECTION

(71) Applicant: ANALOG DEVICES, INC., Norwood, MA (US)

(72) Inventors: Andrew Y Wang, Wilmington, MA (US); Stefano I D'Aquino, Westford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 185 days.

(21) Appl. No.: 13/800,731

(22) Filed: Mar. 13, 2013

(65) Prior Publication Data

US 2014/0269866 A1    Sep. 18, 2014

(51) Int. Cl.
*H04B 17/00*    (2015.01)
*H03K 3/3562*    (2006.01)
*H04B 1/10*    (2006.01)

(52) U.S. Cl.
CPC .......... *H04B 17/00* (2013.01); *H03K 3/35625* (2013.01); *H04B 1/1027* (2013.01)

(58) Field of Classification Search
CPC combination set(s) only.
See application file for complete search history.

(56) References Cited

U.S. PATENT DOCUMENTS

| | | | |
|---|---|---|---|
| 3,764,926 A * | 10/1973 | Rypinski, Jr. | 329/305 |
| 4,065,722 A * | 12/1977 | Francis | 329/300 |
| 4,492,926 A | 1/1985 | Kusakabe et al. | |
| 5,051,707 A | 9/1991 | Fujita | |
| 6,111,463 A | 8/2000 | Kimura | |
| 6,177,815 B1 * | 1/2001 | Baumgartner et al. | 327/76 |
| 6,831,521 B1 * | 12/2004 | Abidin et al. | 330/308 |
| 7,176,726 B2 * | 2/2007 | Bock | 327/18 |
| 2014/0192841 A1 * | 7/2014 | Zhan et al. | 375/130 |

FOREIGN PATENT DOCUMENTS

DE    40 10 283 A1    10/1991

OTHER PUBLICATIONS

German Office Action of Sep. 28, 2015 and English translation thereof for German Patent Application No. 102014103153.9, filed on Mar. 10, 2014. 16 pages.

* cited by examiner

*Primary Examiner* — Junpeng Chen
(74) *Attorney, Agent, or Firm* — Knobbe Martens Olson & Bear LLP

(57) ABSTRACT

Apparatus and methods for loss of signal detection are provided. In one embodiment, a detection circuit for monitoring an input includes a small signal boost circuit, a rectifier circuit, a low-pass filter, and one or more comparators. The small signal boost circuit can generate an amplified signal by providing a first amount of gain to an input signal when the input signal is relatively small, but can saturate and provide reduced gain without external gain control adjustment when the input signal does not have a relatively small magnitude. The rectifier circuit can rectify the boosted signal to generate a rectified signal, and the low-pass filter can filter the rectified signal to generate a filtered signal. The one or more comparators can compare the filtered signal to one or more decision threshold voltages to determine the presence or absence of the input signal on the input.

25 Claims, 12 Drawing Sheets

APPARATUS AND METHODS FOR LOSS OF SIGNAL DETECTION

BACKGROUND

1. Field

Embodiments of the invention relate to electronic devices, and more particularly, to loss of signal detection in electronic communications systems.

2. Description of the Related Technology

Certain electronic systems can include a loss of signal detection circuit to determine whether or not an input signal is present at an input. For example, the loss of signal detection circuit can generate a detection signal that can be controlled to a first state when the input signal is not detected and to a second state when the input signal is detected.

There is a need for improved loss of signal detection circuits.

SUMMARY

In one embodiment, an apparatus includes a detection circuit configured to monitor an input. The detection circuit includes a first gain circuit operatively coupled to the input and configured to provide gain from input to output to generate an amplified signal, a first rectifier circuit configured to rectify the amplified signal to generate a rectified signal, a first low-pass filter configured to filter the rectified signal to generate a filtered signal, and one or more comparators configured to evaluate the filtered signal to determine a presence or absence of a differential signal at the input. The first gain circuit is configured to provide at least a first amount of gain for input signal levels smaller than a first level, and the first gain circuit is configured to saturate to reduce gain from the first gain amount without external gain control adjustment for input levels higher than a second level. The second level is higher than the first level.

In another embodiment, an electronically implemented method of loss of signal detection is provided. The method includes generating an amplified signal by amplifying a voltage difference between a first input terminal and a second input terminal using a gain circuit. Generating the amplified signal comprises providing at least a first amount of gain when a magnitude of the voltage difference is less than a first level, and saturating the gain circuit without external gain control adjustment when the magnitude of the voltage difference is greater than a second level. The second level is greater than the first level. The method further includes rectifying the amplified signal to generate a rectified signal using a rectifier circuit, filtering the rectified signal to generate a filtered signal using a low pass filter, and determining a presence or absence of a differential input signal between the first and second input terminals by evaluating the filtered signal using one or more comparators.

In another embodiment, an apparatus includes a detection circuit configured to monitor an input. The detection circuit includes a small signal gain circuit operatively coupled to the input and configured to generate a first signal. The small signal gain circuit is configured to provide at least a first amount of gain for input signal levels smaller than a first level, and to provide attenuation without external gain control for input levels higher than a second level. The second level is higher than the first level. The detection circuit further includes a linear gain circuit operatively coupled to the input. The linear gain circuit has an input range extending at least between the first and second levels, and the linear gain circuit is configured to generate a second signal by providing substantially constant gain for input levels in the input range. The detection circuit further includes a rectifier circuit configured to receive a third signal indicative of the sum of the first signal and the second signal. The rectifier circuit is configured to rectify the third signal to generate a rectified signal. The detection circuit further includes a first low-pass filter configured to filter the rectified signal to generate a filtered signal and one or more comparators configured to evaluate the filtered signal to determine a presence or absence of a differential signal at the input.

DETAILED DESCRIPTION OF EMBODIMENTS

Figure 1:
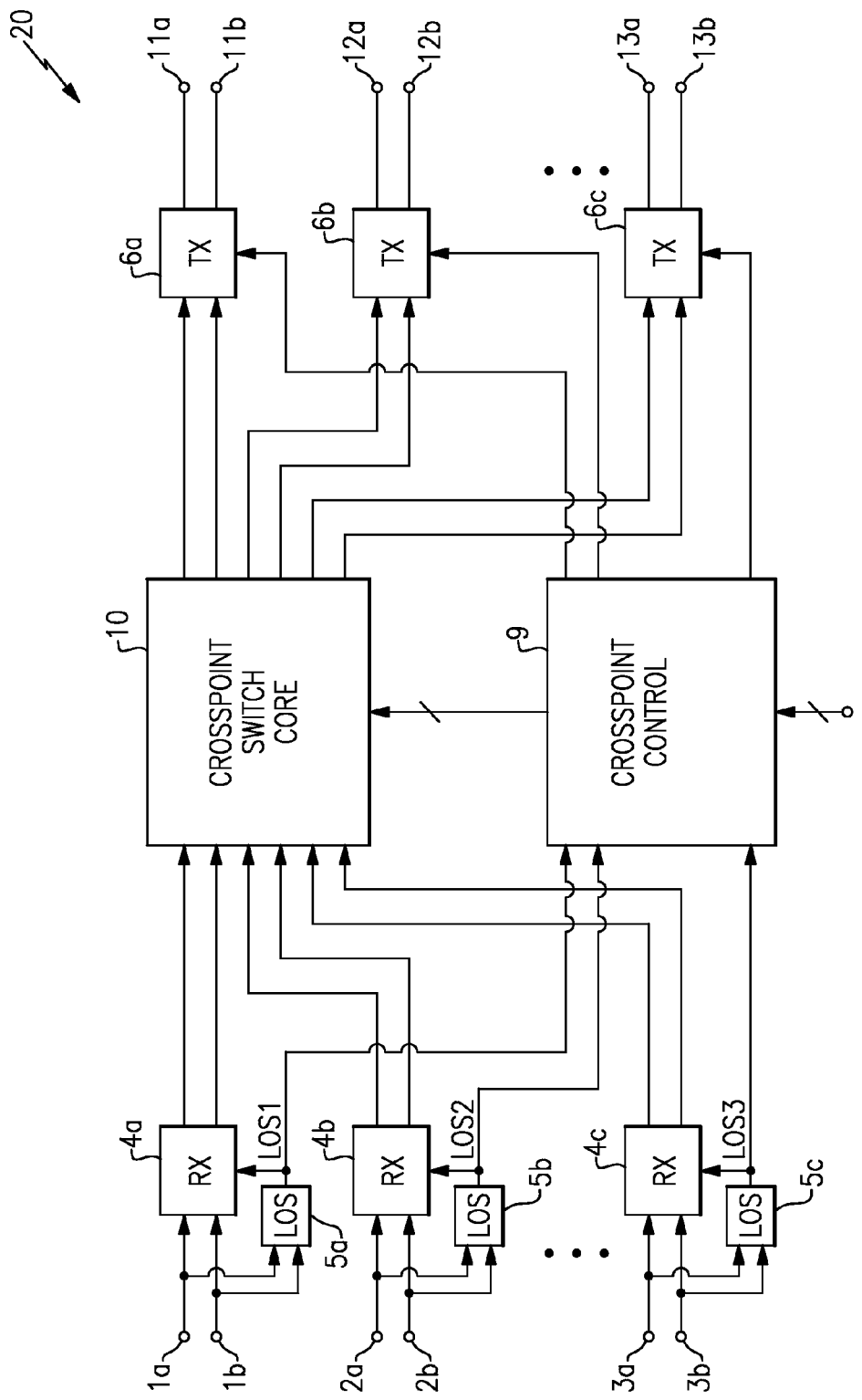
FIG. 1 is a schematic diagram of one example of an electronic system including loss of signal detection circuits.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

One Example of an Electronic System Including Loss of Signal Detection Circuits

FIG. 1 is a schematic diagram of one example of an electronic system 20. The electronic system 20 includes a first receive circuit 4a, a second receive circuit 4b, a third receive circuit 4c, a first loss of signal detector or detection circuit 5a, a second loss of signal detection circuit 5b, a third loss of signal detection circuit 5c, a first transmit circuit 6a, a second transmit circuit 6b, a third transmit circuit 6c, a crosspoint control circuit 9, and a crosspoint switch core circuit 10.

As shown in FIG. 1, the electronic system 20 includes a first differential input terminal or input 1a, 1b, a second differential input terminal 2a, 2b, and a third differential input terminal 3a, 3b. Additionally, the electronic system 20 includes a first differential output terminal or output 11a, 11b, a second differential output terminal 12a, 12b, and a third differential output terminal 13a, 13b.

The first to third receive circuits 4a-4c can be used to generate first to third crosspoint input signals by amplifying or buffering signals received on the first to third differential input terminals 1a-1b, 2a-2b, 3a-3b, respectively. The crosspoint switch core circuit 10 includes first to third differential inputs configured to receive the first to third crosspoint input signals, respectively. The crosspoint switch core circuit 10 further includes a control input and first to third differential outputs, which are configured to generate first to third crosspoint output signals, respectively. The first to third crosspoint output signals are provided to the first to third transmit circuits 6a-6c, respectively. The first to third transmit circuits 6a-6c can be used to amplify or buffer the first to third crosspoint output signals to generate first to third transmit signals on the first to third differential output terminals 11a-11b, 12a-12b, 13a-13b, respectively.

The crosspoint switch core circuit 10 can be used to route one or more of the crosspoint input signals received at the core circuit's differential inputs to one or more of the core circuit's differential outputs. The routing configuration of the crosspoint switch core circuit 10 can be controlled using the crosspoint control circuit 9, such as by programming routing information into a crosspoint map of the crosspoint control circuit 9. In one example, the crosspoint switch core circuit 10 is configured to route a first crosspoint input signal received at the first differential input to the third differential output, and to route a second crosspoint signal received at the second differential input to the first and second differential outputs. In another example, the crosspoint switch core circuit 10 is configured to route a third crosspoint input signal received at the third differential input to the first, second, and third differential outputs. Although two examples of routing configurations of the crosspoint switch core circuit 10 have been described for illustrative purposes, the crosspoint switch core circuit 10 can be configured to route signals in other ways.

Although the crosspoint switch core circuit 10 is illustrated as including three differential inputs and three differential outputs, the crosspoint switch core circuit 10 can be configured to include more or fewer inputs and/or outputs. Similarly, the electronic system 20 can include more or fewer receive circuits, transmit circuits, and/or loss of signal detection circuits.

Crosspoint switches can be used in a wide variety of applications. For example, networking systems such as enterprise and/or metro networks can use crosspoint switches for routing high-speed signals. Crosspoint switches can also be used in broadcast video applications, including, for example, video-on-demand and/or in-flight entertainment applications.

In the illustrated configuration, the first to third differential input terminals 1a-1b, 2a-2b, 3a-3b have been coupled not only to the first to third receive circuits 4a-4c, respectively, but also to the first to third loss of signal detection circuits 5a-5c, respectively. The first to third loss of signal detection circuits 5a-5c can be used to determine whether or not any input signals are present at the first to third differential input terminals 1a-1b, 2a-2b, 3a-3b, respectively. For example, the first loss of signal detection circuit 5a can be used to generate a first detection signal LOS1 indicating whether or not an input signal is present at the first differential input terminal 1a, 1b. Similarly, the second loss of signal detection circuit 5b can be used to generate a second detection signal LOS2 indicating whether or not an input signal is present at the second differential input terminal 2a, 2b, and the third loss of signal detection circuit 5c can be used to generate a third detection signal LOS3 indicating whether or not an input signal is present at the third differential input terminal 3a, 3b.

The first to third detection signals LOS1-LOS3 can be used for a variety of purposes. For example, in the illustrated configuration, the first to third detection signals LOS1-LOS3 can be provided to the first to third receive circuits 4a-4c, respectively, and can advantageously be used to disable a corresponding receive circuit when an input signal is not detected to reduce power consumption and/or power dissipation. Furthermore, in the illustrated configuration, the first to third detection signals LOS1-LOS3 have been provided to the crosspoint control circuit 9, which can use the first to third detection signals LOS1-LOS3 for a variety of purposes. For example, in one embodiment, the crosspoint control circuit 9 uses the first to third detection signals LOS1-LOS3 to disable corresponding transmit circuits. For instance, when a digital control input D of the crosspoint control circuit 9 indicates that the crosspoint switch core circuit 10 should route a signal received at the core circuit's first differential input to the core circuit's second differential output, the crosspoint control circuit 9 can disable the second transmit circuit 6b when the first detection signal LOS1 indicates that an input signal is not present at the first differential input terminal 1a, 1b.

Although FIG. 1 illustrates one example of an electronic system suitable for use with the loss of signal detection circuits described herein, other configurations are possible. Thus, one or more of the detection circuits described herein can be used in other configurations of electronic systems, including, for example, in other configurations of crosspoint switches and/or in other electronic systems having a need for signal loss detection.

Overview of Various Examples of Loss of Signal Detection Circuits and Systems

Apparatus and methods for loss of signal detection are provided herein. In certain implementations, a loss of signal detection circuit is provided. The loss of signal detection circuit can be coupled to an input, and can include a small signal boost circuit, a rectifier circuit, a low-pass filter, and one or more comparators. The small signal boost circuit can generate an amplified or boosted signal by amplifying an input signal received on the input when the input signal has a relatively small magnitude. For example, the small signal boost circuit can provide a first amount of gain when the input signal is relatively small, but can saturate and provide reduced gain without external gain control adjustment when the input signal does not have a relatively small magnitude. The rectifier can rectify the boosted signal to generate a rectified signal, and the low-pass filter can filter the rectified signal to generate a filtered signal. The one or more comparators can compare the filtered signal to one or more decision threshold voltages to determine the presence or absence of the input signal being applied to the input. For example, the input signal can correspond to a media signal, such as an audio/video signal. The audio/video signal can be a baseband signal or a signal that is modulated onto a radio frequency (RF) carrier. Boosting the input signal when the input signal has a relatively small magnitude can aid in detecting input signals that are relatively small or weak.

Figure 2:
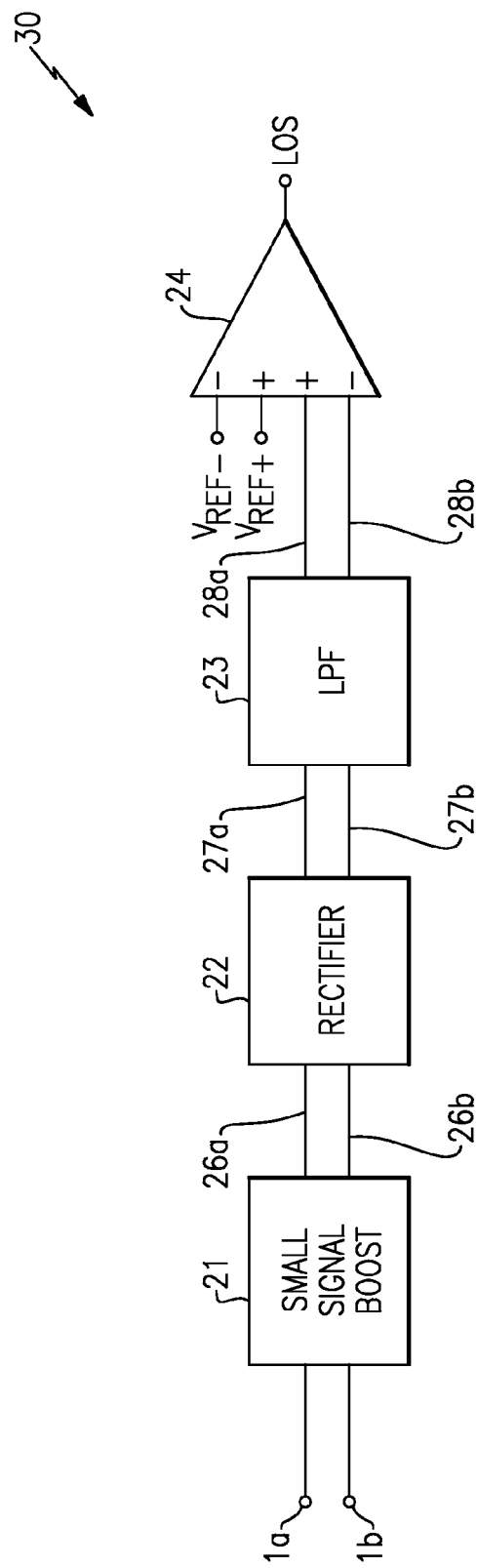
FIG. 2 is a schematic diagram of one embodiment of a loss of signal detection system.

FIG. 2 is a schematic diagram of one embodiment of a loss of signal detection system 30. The loss of signal detection system 30 includes a small signal boost or gain circuit 21, a rectifier circuit 22, a low-pass filter 23, and a comparator 24.

The small signal boost circuit 21 includes a differential input electrically coupled to a differential input terminal 1a, 1b. The small signal boost circuit 21 further includes a differential output electrically connected to a differential input of the rectifier circuit 22. The rectifier circuit 22 further includes a differential output electrically connected to a differential input of the low-pass filter 23. The comparator 24 includes a first differential input electrically connected to a differential output of the low-pass filter 23, a second differential input configured to receive a differential decision threshold voltage $V_{REF+}$, $V_{REF-}$, and an output configured to generate a detection signal LOS. While illustrated with a differential decision threshold voltage $V_{REF+}$, $V_{REF-}$, in alternative embodiments, a single-ended threshold voltage can be provided as an input to the comparator 24 and converted to differential as necessary.

The small signal boost circuit 21 can be used to generated a differential boosted or amplified signal 26a, 26b by amplifying a differential input signal received on the differential input terminal 1a, 1b when the differential input signal is relatively small. For example, in certain configurations, the small signal boost circuit 21 can provide a first amount of amplification to the differential input signal when the magnitude of the differential input signal is less than a first voltage level. However, the small signal boost circuit 21 can saturate to reduce gain from the first gain amount without external gain control adjustment when the magnitude of the differential input signal is greater than a second voltage level higher than the first voltage level. The small signal boost circuit 21 can thus boost relatively small input signals, without having to use variable gain adjustment schemes, which can be difficult to implement in high speed applications and/or can introduce systematic offsets or distortions. Although the small signal boost circuit 21 is described as providing different gain amounts at the first and second input voltage levels, persons having ordinary skill in the art will appreciate that the small signal boost circuit 21 can provide a continuum of gain values across input voltage level. Thus, unlike variable gain circuits that have distinct gain levels or settings, the gain of the small signal boost circuit 21 can have a continuous or analog transition between the first and second input voltage levels.

The rectifier circuit 22 can be used to rectify the boosted differential signal 26a, 26b received from the small signal boost circuit 21 to generate a differential rectified signal 27a, 27b. For example, in certain configurations, the differential rectified signal 27a, 27b generated by the rectifier circuit 22 can change in relation to an absolute value of the differential boosted signal 26a, 26b. Since the gain of the rectifier circuit 22 can typically be relatively low for small input signals, including the small signal boost circuit 21 in the loss of signal detection system 30 can allow the rectifier circuit 22 to generate the differential rectified signal 27a, 27b with sufficient amplitude for reliable detection of relatively small input signals.

The low-pass filter 23 can be used to filter or remove high frequency components of the differential rectified signal 27a, 27b to generate a differential filtered signal 28a, 28b. By filtering the differential rectified signal 27a, 27b in this manner, the robustness of the loss of signal detection system 30 to noise or relatively rapid changes in voltage at the differential input terminal 1a, 1b can be enhanced. Accordingly, the low-pass filter 23 can be used to filter out amplitude variation in the differential rectified signal 27a, 27b generated by the rectifier circuit 22. The filtering characteristic of the low-pass filter 23 can aid in achieving a desired speed versus accuracy characteristic of the loss of signal detection system 30. For example, when the low-pass filter 23 is configured to have a relatively low cutoff frequency, the loss of signal detection system 30 can have enhanced noise immunity but a slower detection speed. In contrast, when the low-pass filter 23 is configured to have a relatively high cutoff frequency, the loss of signal detection system 30 can have a faster detection speed but reduced noise immunity. In one embodiment, the low-pass filter 23 comprises a pair of capacitors.

The comparator 24 can be used to compare the differential filtered signal 28a, 28b generated by the low-pass filter 23 to the differential decision threshold voltage $V_{REF+}$, $V_{REF-}$, and to generate the detection signal LOS based on the result. For example, when no input signal is present at the differential input terminal 1a, 1b, the magnitude of the differential filtered signal 28a, 28b can be relatively small such that the differential filtered signal 28a, 28b has a voltage that is smaller than that of the differential decision threshold voltage $V_{REF+}$, $V_{REF-}$.

Although FIG. 2 illustrates one configuration of a loss of signal detection system in which a small signal boost circuit can be used, the small signal boost circuits described herein can be used in other detection systems.

Figure 3A:
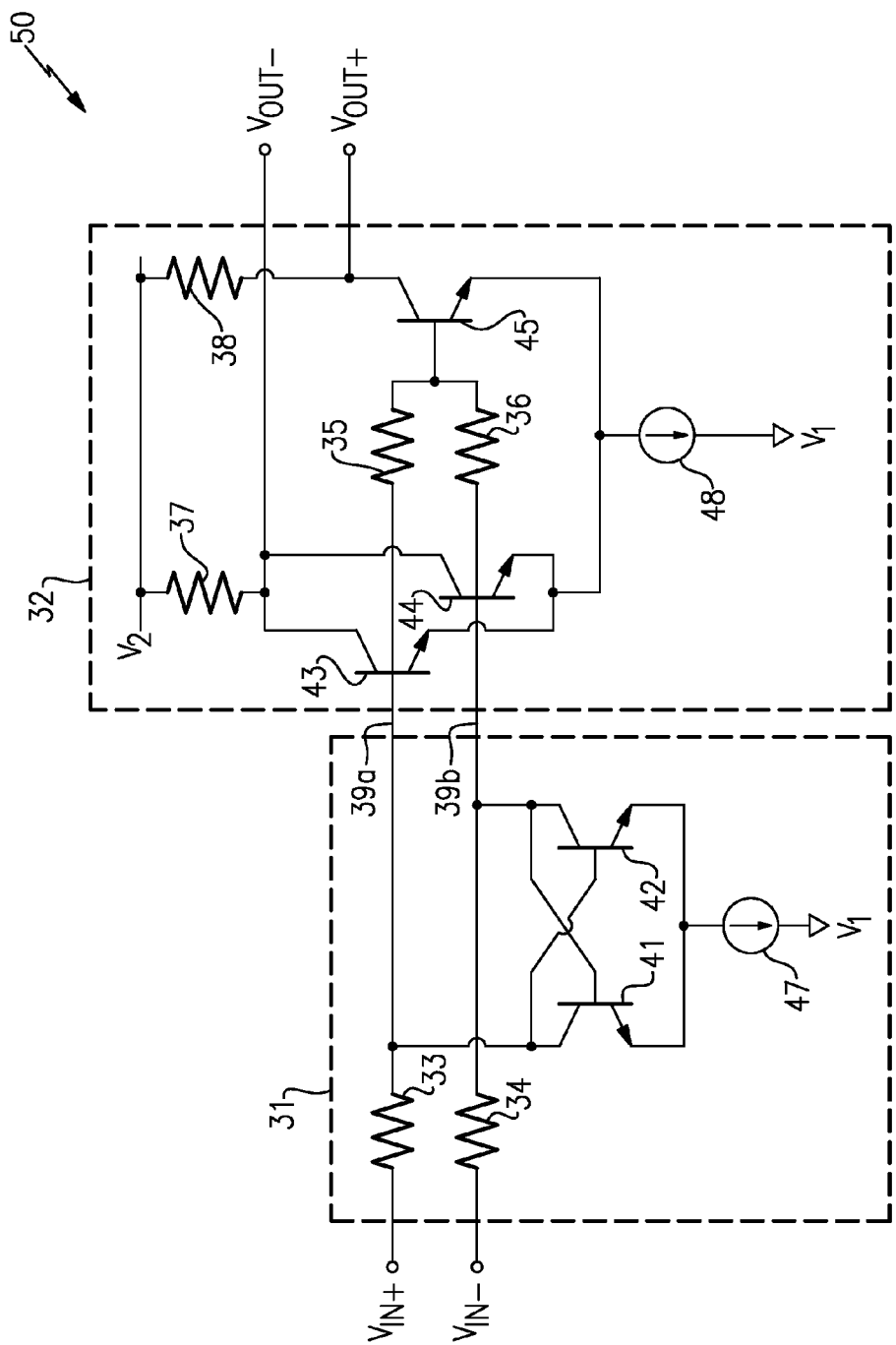
FIG. 3A is a circuit diagram of one embodiment of a small signal boost circuit and a rectifier.

FIG. 3A is a circuit diagram 50 of one embodiment of a small signal boost circuit 31 and a rectifier circuit 32. The small signal boost circuit 31 can receive a differential input signal between first and second input terminals $V_{IN+}$, $V_{IN-}$, and can generate a differential boosted signal 39a, 39b, which corresponds to a difference between a first boosted signal 39a and a second boosted signal 39b. The rectifier circuit 32 can receive the differential boosted signal 39a, 39b and can generate a differential rectified signal between first and second output terminals $V_{OUT+}$, $V_{OUT-}$.

The small signal boost circuit 31 includes a first boost resistor 33, a second boost resistor 34, a first bipolar boost transistor 41, a second bipolar boost transistor 42, and a first current source 47. The first boost resistor 33 includes a first end electrically connected to the first input terminal $V_{IN+}$ and a second end electrically connected to a collector of the first bipolar boost transistor 41 and to a base of the second bipolar boost transistor 42 at a node configured to generate the first boosted signal 39a. The second boost resistor 34 includes a first end electrically connected to the second input terminal $V_{IN-}$ and a second end electrically connected to a collector of the second bipolar boost transistor 42 and to a base of the first bipolar boost transistor 41 at a node configured to generate the second boosted signal 39b. The first bipolar boost transistor 41 further includes an emitter electrically connected to an emitter of the second bipolar boost transistor 42 and to a first end of the first current source 47. The first current source 47 further includes a second end electrically connected to a first supply voltage $V_1$, which can be, for example, a ground or power low supply.

The rectifier circuit 32 includes a first common-mode resistor 35, a second common-mode resistor 36, a first load resistor 37, a second load resistor 38, a first bipolar rectification transistor 43, a second bipolar rectification transistor 44, a third bipolar rectification transistor 45, and a second current source 48. The first bipolar rectification transistor 43 includes a base electrically connected to a first end of the first common-mode resistor 35 at a node configured to receive the first boosted signal 39a. The first bipolar rectification transistor 43 further includes a collector electrically connected to a collector of the second bipolar rectification transistor 44, to a first end of the first load resistor 37, and to the second output terminal $V_{OUT-}$. The second bipolar rectification transistor 44 further includes a base electrically connected to a first end of the second common-mode resistor 36 at a node configured to receive the second boosted signal 39b. The third bipolar rectification transistor 45 further includes an emitter electrically connected to an emitter of the second bipolar rectification transistor 44, to a first end of the second current source 48, and to an emitter of the first bipolar rectification transistor 43. The second current source 48 further includes a second end electrically connected to the first supply voltage $V_1$. The third bipolar rectification transistor 45 further includes a base electrically connected to a second end of the first common-mode resistor 35 and to a second end of the second common-mode resistor 36. The third bipolar rectification transistor 45 further includes a collector electrically connected to the first output terminal $V_{OUT+}$ and to a first end of the second load resistor 38. The first and second load resistors 37, 38 each further include a second end electrically connected to a second supply voltage $V_2$, which can be, for example, a power high supply.

In the illustrated configuration, the small signal boost circuit 31 can amplify a differential input signal received between the first and second input terminals $V_{IN+}$, $V_{IN-}$ when the differential input signal has a relatively small magnitude. However, when the differential input signal does not have a relatively small magnitude, the small signal boost circuit 31 can saturate, thereby passing the differential input signal to the rectifier circuit 32 with a relatively small amount of amplification.

For example, when a voltage difference between the first and second input terminals $V_{IN+}$, $V_{IN-}$ is about 0 V, about half of a boost current of the first current source 47 can flow through the first bipolar boost transistor 41 and about half of the boost current can flow through the second bipolar boost transistor 42. However, as the voltage of one of the first and second input terminals $V_{IN+}$, $V_{IN-}$ increases relative to the other, a relatively large amount of the boost current can be steered either toward the first bipolar boost transistor 41 or toward the second bipolar boost transistor 42. For example, the bases and collectors of the first and second bipolar boost transistors 41, 42 are cross-coupled to provide positive feedback. The positive feedback can operate to steer the boost current through one bipolar boost transistor or the other. For example, when a voltage of the first input terminal $V_{IN+}$ is greater than a voltage of the second input terminal $V_{IN-}$, a substantial portion of the boost current can flow though the second bipolar boost transistor 42. Additionally, when the voltage of the second input terminal $V_{IN-}$ is greater than a voltage of the first input terminal $V_{IN+}$, a substantial portion of the boost current can flow though the first bipolar boost transistor 41.

The gain provided by the small signal boost circuit 31 can be relatively large for small input signals. However, once the boost current is steered into one boost transistor or the other, the gain of the small signal boost circuit 31 can decrease or roll off. In one embodiment, the small signal boost circuit 31 is configured to amplify a differential input signal having a voltage magnitude of less than about 20 mV by a factor of at least 2.5, but to amplify a differential input signal having a voltage magnitude greater than about 60 mV by a factor of less than 1.5. Although one example of gains for different input voltage levels has been provided, other configurations are possible.

The gain of the small signal boost circuit 31 can be controlled in part based on a magnitude of the boost or feedback current of the first current source 47. For example, the gain of the small signal boost circuit 31 can be enhanced by increasing the magnitude of the boost current. In certain implementations, the boost current is selected to have a magnitude in the range of about 50 µA to about 400 µA. However, other configurations are possible.

The gain of the small signal boost circuit 31 can also be controlled in part using the first and second boost resistors 33, 34. For example, the gain of small signal boost circuit 31 can be based on a current-resistance or I*R voltage drop across the first and second boost resistors 33, 34. In certain implementations, the resistance of each of the first and second boost resistors 33, 34 is selected to be in the range of about 50Ω to about 400Ω. However, other configurations are possible.

Cascading the small signal boost circuit 31 and the rectifier circuit 32 can operate to effectively increase the gain from the first and second input terminals $V_{IN+}$, $V_{IN-}$ to the first and second output terminals $V_{OUT+}$, $V_{OUT-}$ in the small signal input region. Since the rectifier circuit 32 can have a relatively low gain in the small signal input region, the small signal boost circuit 31 can operate to increase or widen linear range.

Figure 3B:
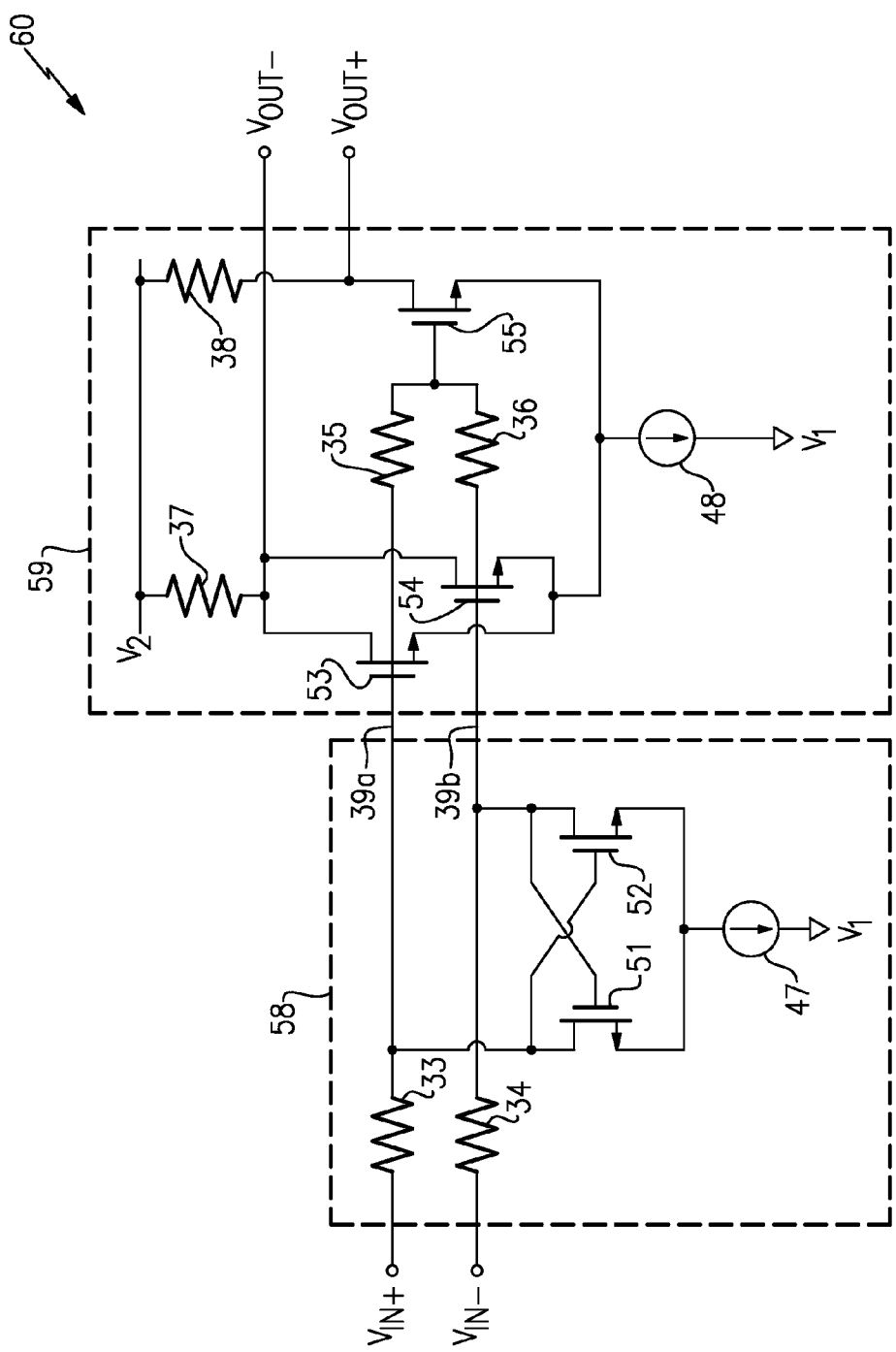
FIG. 3B is a circuit diagram of another embodiment of a small signal boost circuit and a rectifier.

FIG. 3B is a circuit diagram 60 of another embodiment of a small signal boost circuit 58 and a rectifier circuit 59.

The small signal boost circuit 58 includes the first and second boost resistors 33, 34 and the first current source 47, which can be as described earlier. The small signal boost circuit 58 further includes a first metal oxide semiconductor (MOS) boost transistor 51 and a second MOS boost transistor 52. The rectifier circuit 59 includes the first and second common-mode resistors 35, 36, the first and second load resistors 37, 38, and the second current source 48, which can be as described earlier. The rectifier circuit 59 further includes a first MOS rectification transistor 53, a second MOS rectification transistor 54, and a third MOS rectification transistor 55.

As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The circuit diagram 60 of FIG. 3B is similar to the circuit diagram 50 of FIG. 3A, except that the circuit diagram 60 of FIG. 3B illustrates a configuration which has been implemented using MOS transistors rather than bipolar transistors.

For example, the first MOS boost transistor 51 includes a drain electrically connected to a gate of the second MOS boost transistor 52, to the second end of the first boost resistor 33, to the gate of the first MOS rectification transistor 53, and to the first end of the first common-mode resistor 35. The first MOS boost transistor 51 further includes a source electrically connected to a source of the second MOS boost transistor 52 and to the first end of the first current source 47. The first MOS boost transistor 51 further includes a gate electrically connected to a drain of the second MOS boost transistor 52, to the second end of the second boost resistor 34, to a gate of the second MOS rectification transistor 54, and to the first end of the second common-mode resistor 36. The first MOS rectification transistor 53 further includes a drain electrically connected to the first end of the first load resistor 37, to a drain of the second MOS rectification transistor 54, and to the second output terminal $V_{OUT-}$. The first MOS rectification transistor 53 further includes a source electrically connected to a source of the second MOS rectification transistor 54, to the first end of the second current source 48, and to a source of the third MOS rectification transistor 55. The third MOS rectification transistor 55 further includes a gate electrically connected to the second end of the first common-mode resistor 35 and to the second end of the second common-mode resistor 36. The third MOS rectification transistor 55 further includes a drain electrically connected to the first end of the second load resistor 38 and to the first output terminal $V_{OUT+}$. Additional details of the small signal boost circuit 58 and the rectifier circuit 59 can be similar to those described earlier.

Although FIGS. 3A and 3B illustrate configurations of the small signal boost circuit and the rectifier implemented using n-type devices, other configurations are possible. For example, the teachings herein are applicable to complementary configurations implemented using bipolar or MOS transistors having an opposite polarity type, with a corresponding reversal of current directions and voltage biasing.

Figure 4:
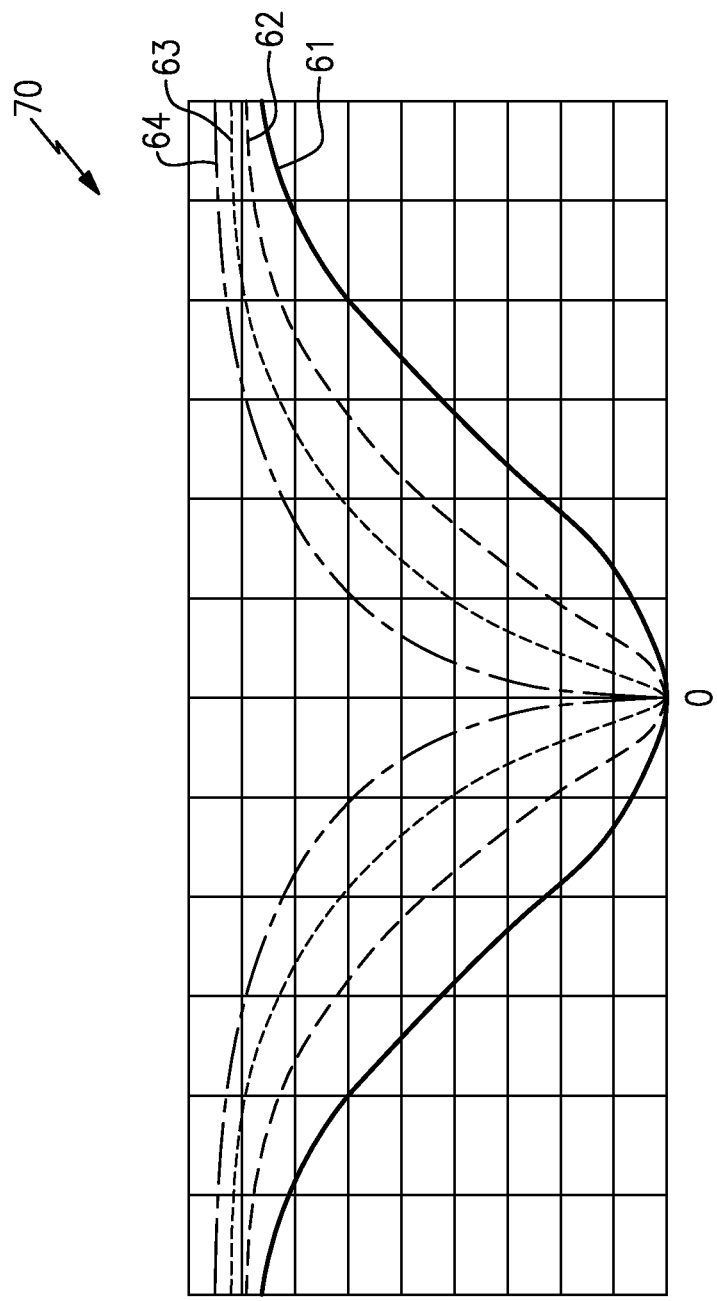
FIG. 4 is a graph of one example of input voltage versus output voltage for four configurations of small signal boost circuits and rectifiers.

FIG. 4 is a graph 70 of one example of input voltage versus output voltage for four configurations of small signal boost circuits and rectifiers. For example, the graph 70 includes a first plot 61, which can correspond to one example of differential input voltage versus differential output voltage for a configuration of the circuit diagram 50 of FIG. 3A in which the small signal boost circuit 31 has been omitted. Additionally, the graph includes a second plot 62, which can correspond to one example of differential input voltage versus differential output voltage for one embodiment of the circuit diagram 50 of FIG. 3A. Furthermore, the graph includes third and fourth plots 63, 64, which can correspond to embodiments similar to that of the second plot 62, but using progressive higher values of boost current.

When an input signal has a relatively small magnitude, certain rectifier circuits can have relatively low gain. Thus, when using the rectifier without a small signal boost circuit, the output signal generated by the rectifier may be too weak to accurately detect a small input signal.

As shown in FIG. 4, using a small signal boost circuit can aid in increasing the rectifier's gain when the input signal is relatively small. Additionally, the amount of gain provided by the small signal boost circuit can be enhanced by increasing the magnitude of the boost current. Additionally, the small signal boost circuit can saturate for large input signals, and thus the gain of the small signal boost circuit can decrease or roll off as the input signal's magnitude increases.

Figure 5A:
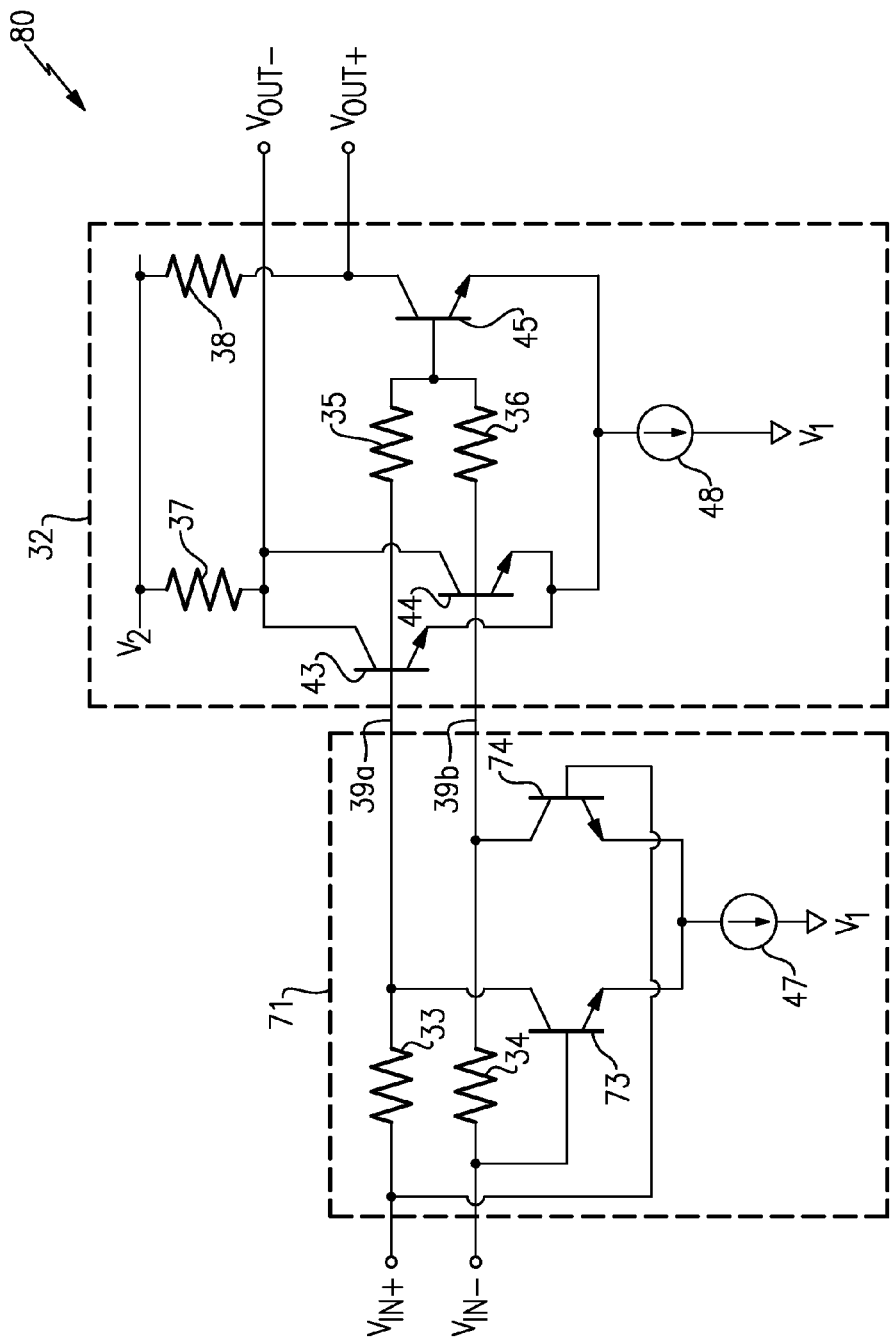
FIG. 5A is a circuit diagram of another embodiment of a small signal boost circuit and a rectifier.

FIG. 5A is a circuit diagram 80 of another embodiment of a small signal boost circuit 71 and a rectifier circuit 32. The small signal boost circuit 71 includes the first and second boost resistors 33, 34 and the first current source 47, which can be as described earlier. The small signal boost circuit 71 further includes a first bipolar boost transistor 73 and a second bipolar boost transistor 74. The rectifier circuit 32 includes first and second common-mode resistors 35, 36, the first and second load resistors 37, 38, the first to third bipolar rectification transistors 43-45, and the second current source 48, which can be as described earlier.

In the illustrated configuration, the first bipolar boost transistor 73 includes a base electrically connected to the second input terminal $V_{IN-}$ and to the first end of the second boost resistor 34. The first bipolar boost transistor 73 further includes a collector electrically connected to the second end of the first boost resistor 33 at a node configured to generate the first boosted signal 39a. The first bipolar boost transistor 73 further includes an emitter electrically connected to an emitter of the second bipolar boost transistor 74 and to the first end of the first current source 47. The second bipolar boost transistor 74 further includes a base electrically connected to the first input terminal $V_{IN+}$ and to the first end of the first boost resistor 33. The second bipolar boost transistor 74 further includes a collector electrically connected to the second end of the second boost resistor 34 at a node configured to generate the second boosted signal 39b.

The first and second bipolar boost transistors 73, 74 can be used to amplify a voltage difference between the first and second input terminals $V_{IN+}$, $V_{IN-}$ when the voltage difference between the terminals is relatively small. For example, the first and second bipolar boost transistors 73, 74 have been configured to operate as a differential pair with the first current source 47 operating to provide a tail current, and thus the voltage difference between the collectors of the first and second bipolar boost transistors 73, 74 can be amplified relatively to the voltage difference between the bases of the first and second bipolar boost transistors 73, 74. However, the gain provided by the first and second bipolar boost transistors 73, 74 can decrease or roll off once the tail current generated by the first current source 47 has been steered through one bipolar boost transistor or the other.

In certain implementations, the small signal boost circuit 71 of FIG. 5A can provide less gain to small input signals relative to the small signal boost circuit 31 of FIG. 3A, which operates using positive feedback. However, in certain implementations the small signal boost circuit 71 of FIG. 5A can also operate with faster speed relative to the small signal boost circuit 31 of FIG. 3A. For example, in contrast to the small signal boost circuit 31 of FIG. 3A in which the bases of the first and second bipolar boost transistors 41, 42 are coupled to the first and second input terminals $V_{IN+}$, $V_{IN-}$ through the first and second boost resistors 33, 34, the small signal boost circuit 71 of FIG. 5A illustrates a configuration in which boost resistors need not be coupled between the bases of the first and second bipolar boost transistors 73, 74 and the first and second input terminals $V_{IN+}$, $V_{IN-}$.

Figure 5B:
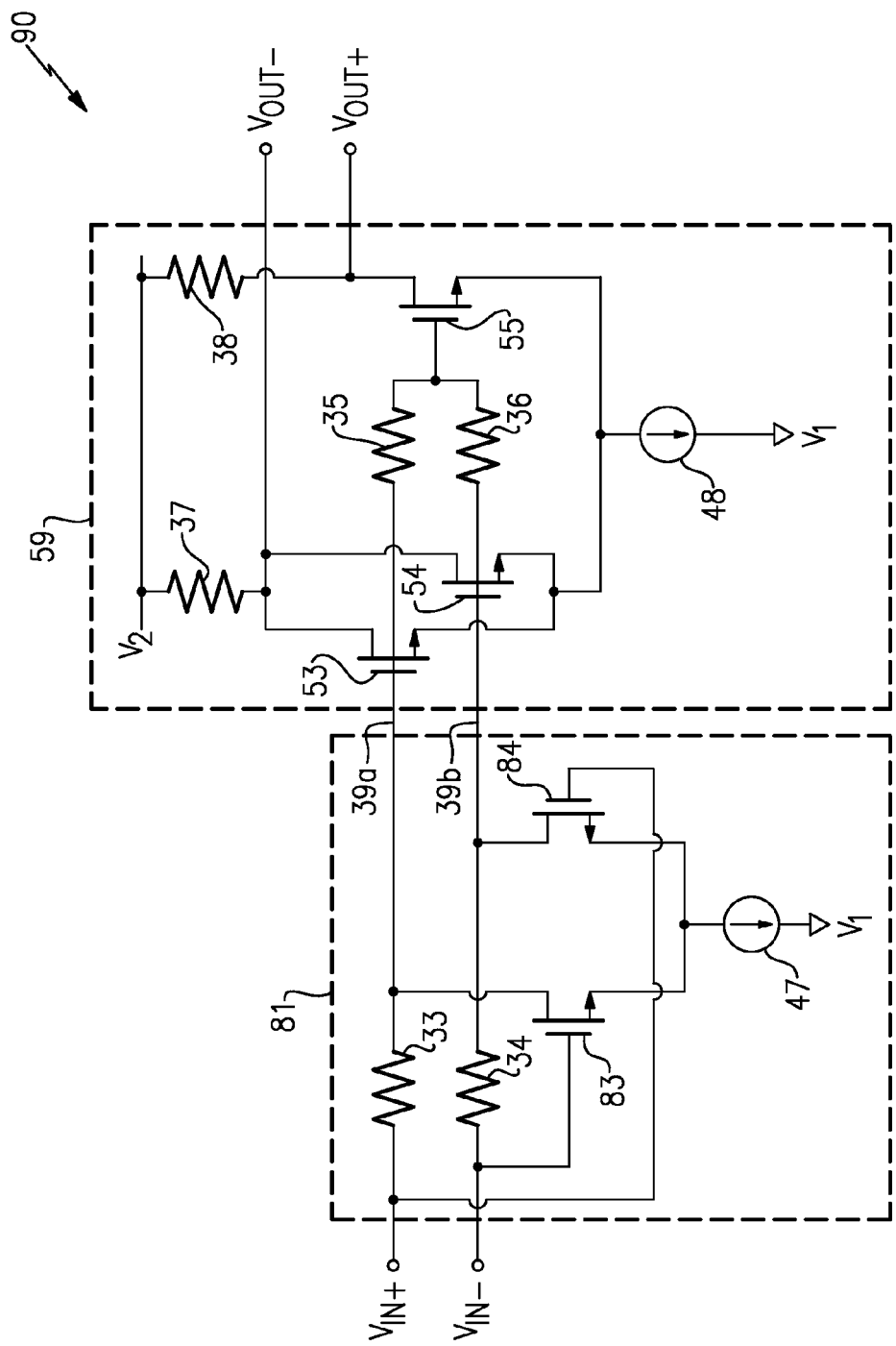
FIG. 5B is a circuit diagram of another embodiment of a small signal boost circuit and a rectifier.

FIG. 5B is a circuit diagram 90 of another embodiment of a small signal boost circuit 81 and a rectifier circuit 59. The rectifier circuit 59 can be as described earlier with respect to FIG. 3B.

The small signal boost circuit 81 of FIG. 5B includes the first and second boost resistors 33, 34, and the first current source 47, which can be as described earlier. The small signal boost circuit 81 further includes first and second MOS boost transistors 83, 84. The small signal boost circuit 81 of FIG. 5B is similar to the small signal boost circuit 71 of FIG. 5A, except that the small signal boost circuit 81 has been implemented using the first and second MOS boost transistors 83, 84 rather than the first and second bipolar boost transistors 73, 74. Additional details can be similar to those described earlier.

Figure 6:
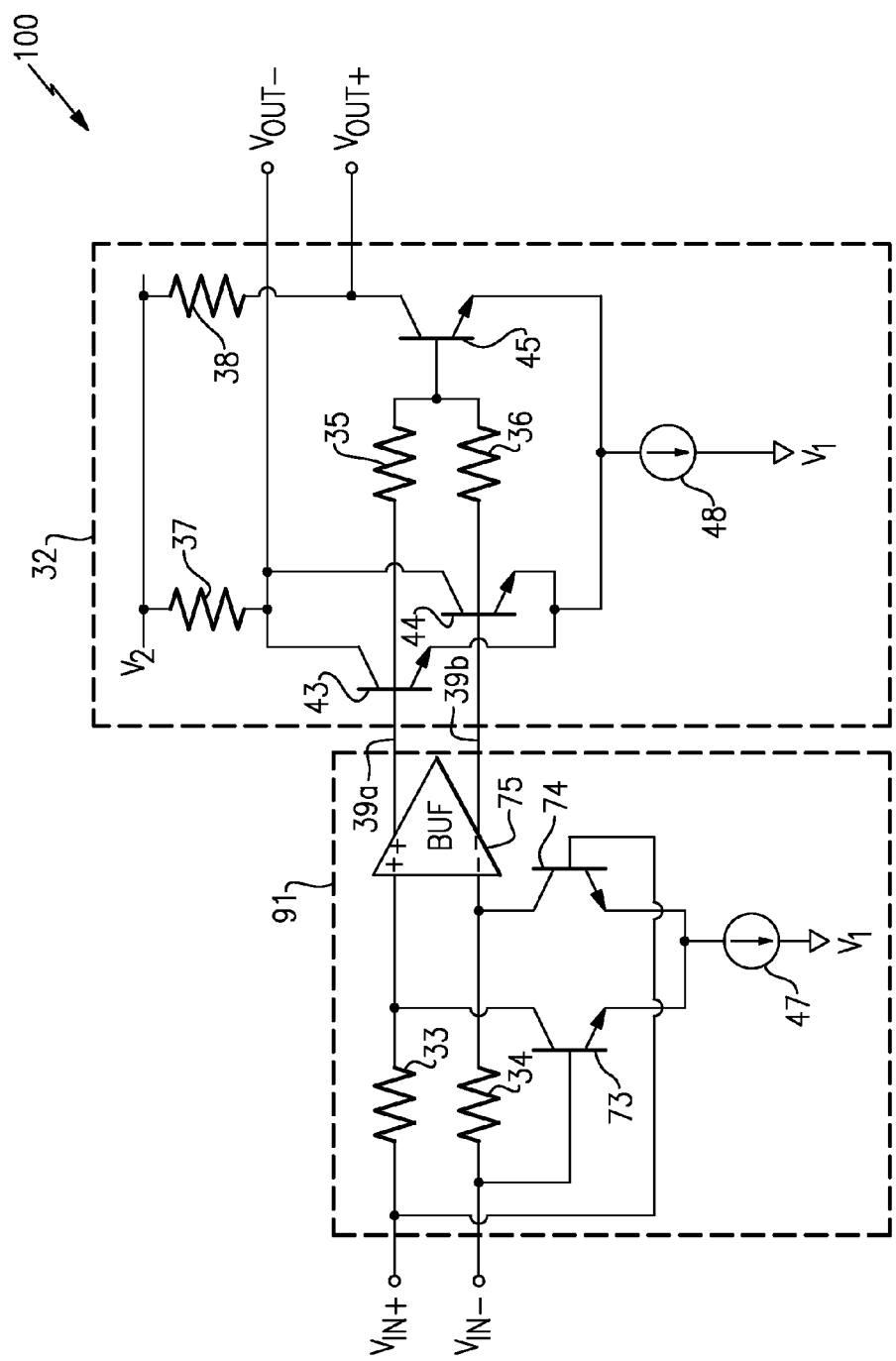
FIG. 6 is a circuit diagram of another embodiment of a small signal boost circuit and a rectifier.

FIG. 6 is a circuit diagram 100 of another embodiment of a small signal boost circuit 91 and a rectifier circuit 32. The small signal boost circuit 91 includes the first and second boost resistors 33, 34, the first and second bipolar boost transistors 73, 74, and the first current source 47, which can be as described earlier. The small signal boost circuit 91 further includes a buffer circuit 75. The rectifier circuit 32 includes the first and second common-mode resistors 35, 36, the first and second load resistors 37, 38, the first to third bipolar rectification transistors 43-45, and the second current source 48, which can be as described earlier.

The configuration illustrated in FIG. 6 is similar to the configuration illustrated in FIG. 5A, except the small signal boost circuit 91 of FIG. 6 further includes the buffer circuit 75. As shown in FIG. 6, the buffer circuit 75 includes a first input electrically connected to the collector of the first bipolar boost transistor 73 and a second input electrically connected to the collector of the second bipolar boost transistor 74. Additionally, the buffer circuit 75 further includes a first output configured to generate the first boosted signal 39a and a second output configured to generate the second boosted signal 39b.

In certain embodiments, a buffer circuit can be used to increase an overall speed of a small signal boost circuit and a rectifier. For example, in the illustrated configuration, the buffer circuit 75 can operate to shield the input capacitance of the rectifier circuit 32 from the output impedance of the boost circuit 71 of FIG. 5A, thereby increasing overall speed. In one embodiment, the buffer circuit 75 is implemented using a differential emitter follower circuit stage. However, other configurations are possible.

Although the circuit diagram 100 illustrates the buffer circuit 75 in one configuration of a small signal boost circuit, the buffer circuit 75 can be included in other configurations of small signal boost circuits. For example, a buffer circuit can be included in the small signal boost circuit 31 of FIG. 3A, the small signal boost circuit 58 of FIG. 3B, the small signal boost circuit 71 of FIG. 5A, and/or the small signal boost circuit 81 of FIG. 5B.

Figure 7:
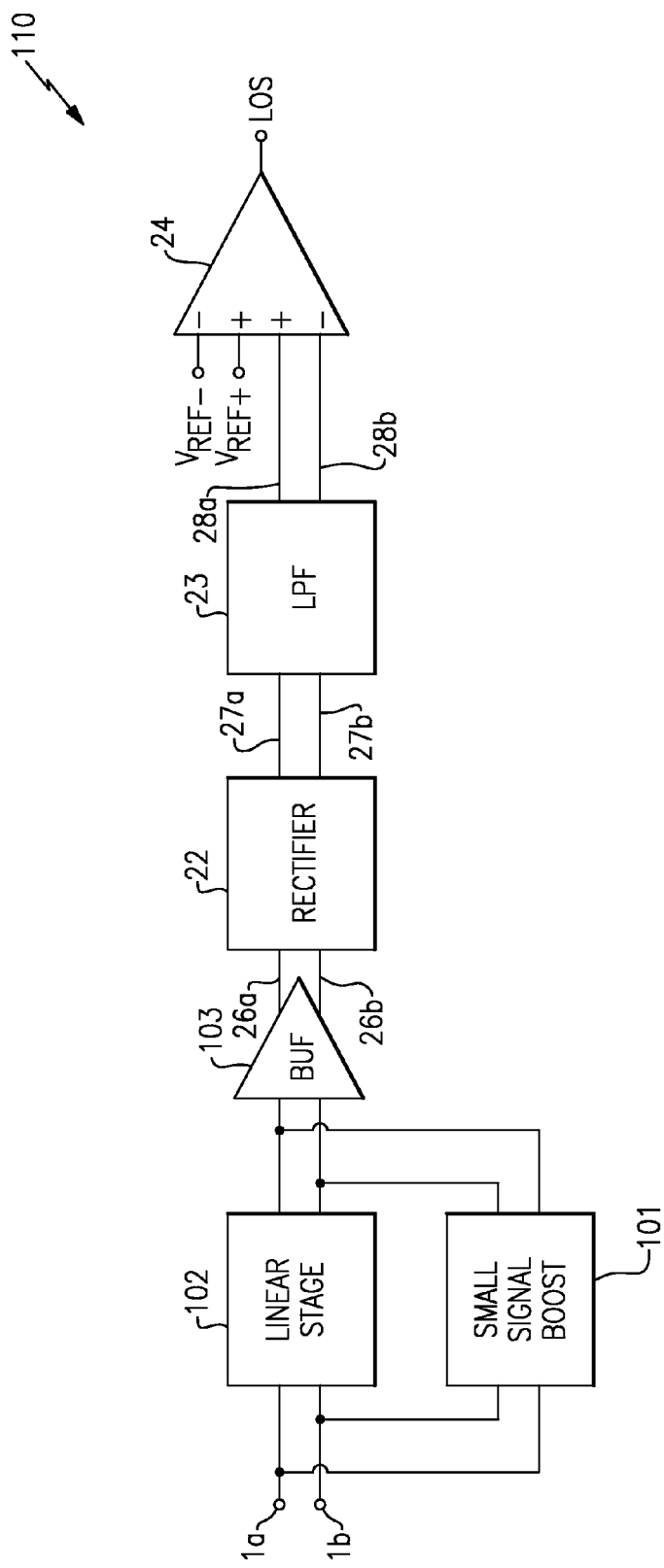
FIG. 7 is a schematic diagram of another embodiment of a loss of signal detection system.

FIG. 7 is a schematic diagram of another embodiment of a loss of signal detection system 110. The loss of signal detection system 110 includes the rectifier circuit 22, the low-pass filter 23, and the comparator 24, which can be as described earlier. The loss of signal detection system 110 further includes a small signal boost circuit 101, a linear stage 102, and a buffer 103.

As shown in FIG. 7, the differential input terminal 1a, 1b is electrically connected to a differential input of the linear stage 102 and to a differential input of the small signal boost circuit 101. Additionally, the linear stage 102 includes a differential output electrically connected to a differential output of the small signal boost circuit 101 and to a differential input of the buffer 103. The buffer 103 further includes a differential output configured to generate the differential boosted signal 26a, 26b, which is provided to the differential input of the rectifier circuit 22.

The loss of signal detection system 110 of FIG. 7 illustrates a configuration in which the linear stage 102 and the small signal boost circuit 101 have been configured to operate in parallel. The small signal boost circuit 101 of FIG. 7 can operate differently that the small signal boost circuit 21 of FIG. 2. For example, both the small signal boost circuit 101 of FIG. 7 and the small signal boost circuit 21 of FIG. 2 can be used to amplify a differential input signal received on the differential input terminal 1a, 1b when the differential input signal is relatively small. However, in contrast to the small signal boost circuit 21 of FIG. 2 which can have a gain that rolls off for differential input signals that are not small, the small signal boost circuit 101 of FIG. 7 can attenuate or block differential input signals that are not small. To aid in detecting such signals, the loss of signal detection system 110 includes the linear stage 102, which operates in parallel with the small signal boost circuit 101, and amplifies input signals across a wide input voltage range.

In the illustrated configuration, the loss of signal detection system 110 further includes the buffer 103, which can be provided between the differential input of the rectifier circuit 22 and the differential outputs of the small signal boost circuit 101 and the linear stage 102. Including the buffer 103 can aid in increasing the speed of the loss of signal detection system 110.

Figure 8A:
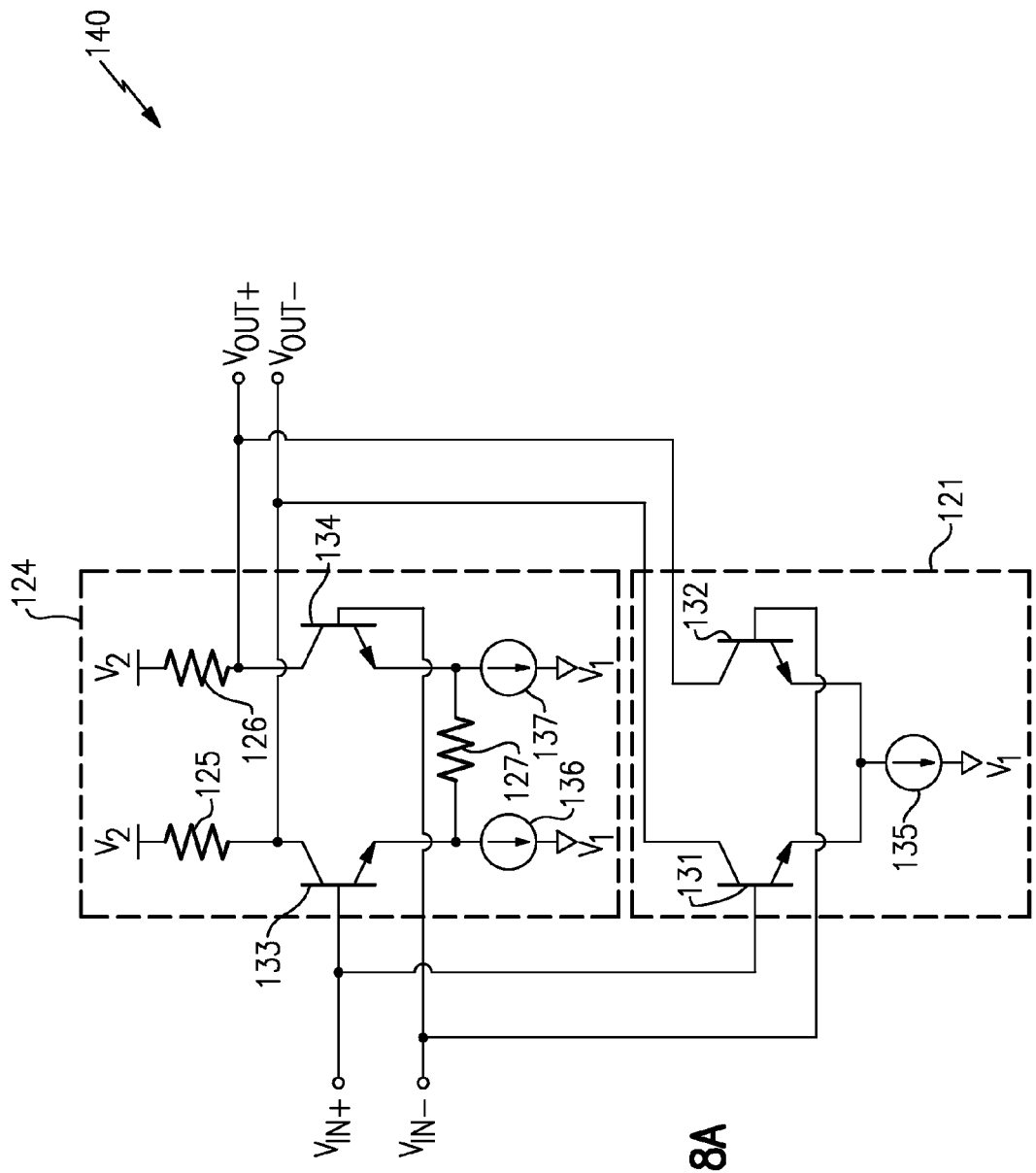
FIG. 8A is a circuit diagram of one embodiment of a small signal boost circuit and a linear stage.

FIG. 8A is a circuit diagram 140 of one embodiment of a small signal boost circuit 121 and a linear stage 124.

The small signal boost circuit 121 includes a first bipolar boost transistor 131, a second bipolar boost transistor 132, and a first current source 135. The linear stage 124 includes a first bipolar input transistor 133, a second bipolar input transistor 134, a first resistor 125, a second resistor 126, a third resistor 127, a second current source 136, and a third current source 137.

The first bipolar boost transistor 131 includes a base electrically connected to a base of the first bipolar input transistor 133 and to a first input terminal $V_{IN+}$. The first bipolar boost transistor 131 further includes an emitter electrically connected to an emitter of the second bipolar boost transistor 132 and to a first end of the first current source 135. The first current source 135 further includes a second end electrically connected to the first supply voltage $V_1$. The second bipolar boost transistor 132 further includes a base electrically connected to a second input terminal $V_{IN-}$ and to a base of the second bipolar input transistor 134. The second bipolar boost transistor 132 further includes a collector electrically connected to a first output terminal $V_{OUT+}$, to a collector of the second bipolar input transistor 134, and to a first end of the second resistor 126. The second resistor 126 further includes a second end electrically connected to the second supply voltage $V_2$. The first resistor 125 includes a first end electrically connected to a second output terminal $V_{OUT-}$, to a collector of the first bipolar input transistor 133, and to a collector of the first bipolar boost transistor 131. The first resistor 125 further includes a second end electrically connected to the second supply voltage $V_2$. The third resistor 127 includes a first end electrically connected to an emitter of the first bipolar input transistor 133 and to a first end of the second current source 136. The third resistor 127 further includes a second end electrically connected to an emitter of the second bipolar input transistor 134 and to a first end of the third current source 137. The second current source 136 further includes a second end electrically connected to the first supply voltage $V_1$. The third current source 137 further includes a second end electrically connected to the first supply voltage $V_1$.

The small signal boost circuit 121 can be used to amplify a differential input signal received between the first and second input terminals $V_{IN+}$, $V_{IN-}$ when the magnitude of the differential input signal is relatively small. However, the small signal boost circuit 21 can attenuate differential input signals that are not relatively small, and the linear stage 124 can be used to amplify such signals.

Figure 8B:
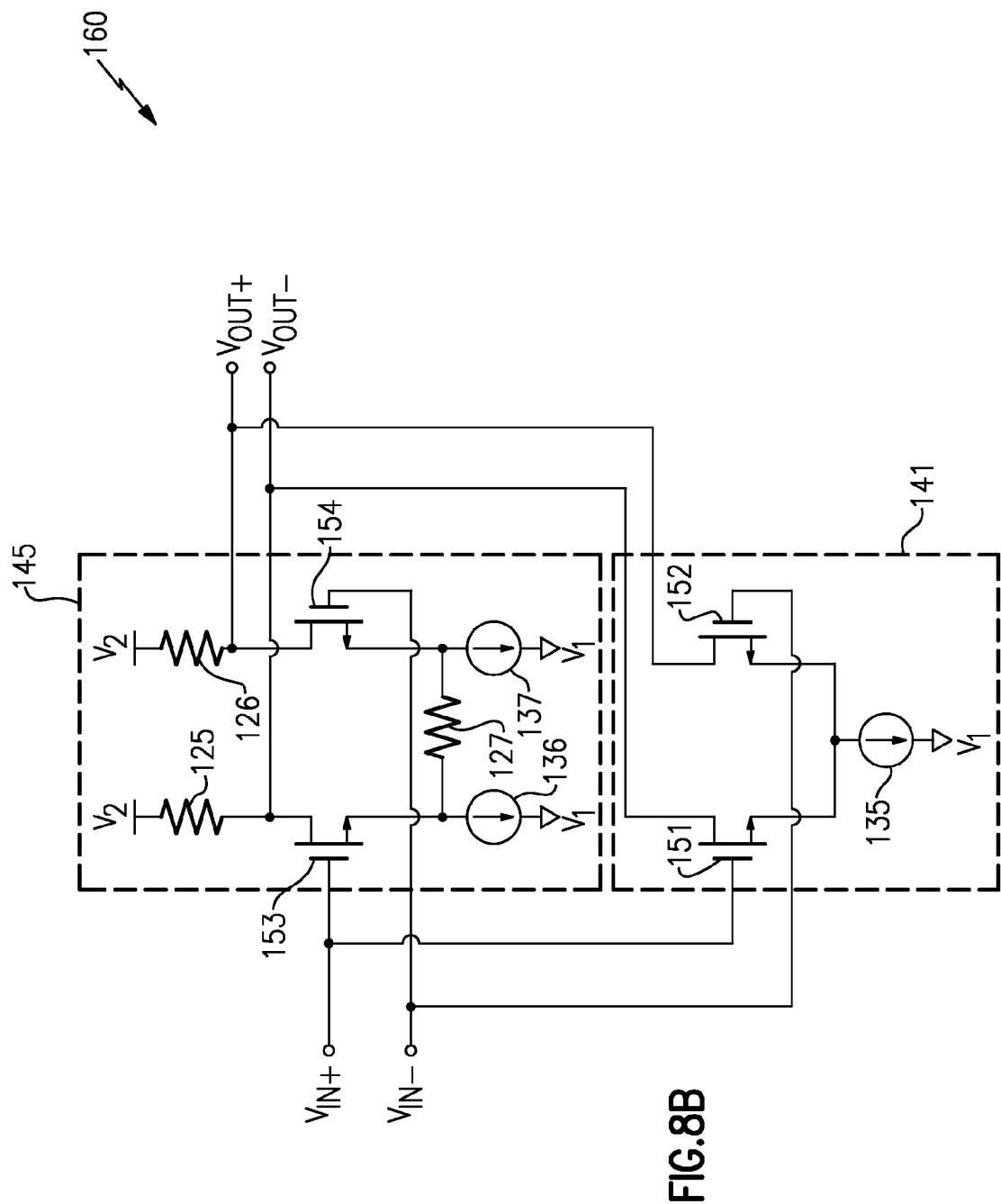
FIG. 8B is a circuit diagram of another embodiment of a small signal boost circuit and a linear stage.

FIG. 8B is a circuit diagram of another embodiment of a small signal boost circuit 141 and a linear stage 145.

The small signal boost circuit 141 includes the first current source 135, which can be as described earlier. The small signal boost circuit 141 further includes a first MOS boost transistor 151 and a second MOS boost transistor 152. The linear stage 145 includes the first to third resistors 125-127 and the second and third current sources 136, 137, which can be as described earlier. The linear stage 145 further includes a first MOS input transistor 153 and a second MOS input transistor 154.

The circuit diagram 160 of FIG. 8B is similar to the circuit diagram 140 of FIG. 8A, except that the circuit diagram 160 of FIG. 8B illustrates a configuration which has been implemented using MOS transistors rather than bipolar transistors. Additional details can be similar to those described earlier.

Figure 9:
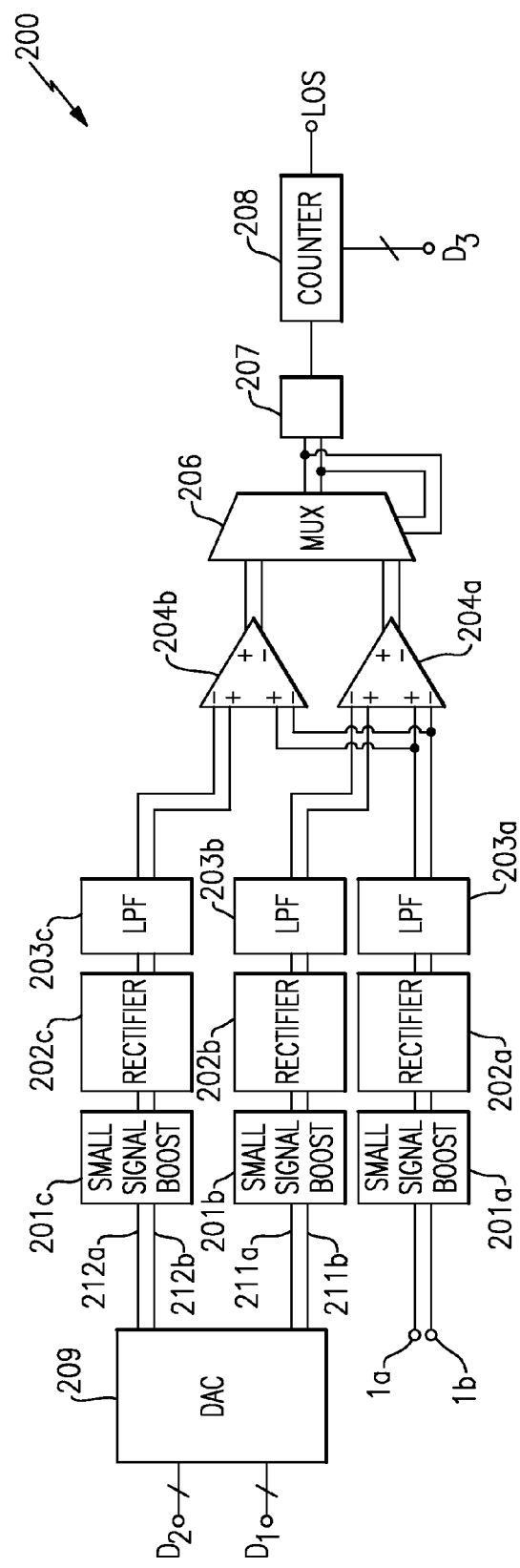
FIG. 9 is a schematic block diagram of another embodiment of a loss of signal detection system.

FIG. 9 is a schematic block diagram of one embodiment of a loss of signal detection system 200. The loss of signal detection system 200 is electrically connected to the differential input terminal 1a, 1b, and is configured to generate a detection signal LOS. Additionally, the loss of signal detection system 200 is configured to receive a first digital control signal $D_1$, a second digital control signal $D_2$, and a third digital control signal $D_3$.

The loss of signal detection system 200 includes first to third small signal boost circuits 201a-201c, first to third rectifiers 202a-202c, first to third low-pass filters 203a-203c, first and second comparators 204a, 204b, a multiplexer 206, a differential to single-ended converter 207, a counter 208, and a digital-to-analog converter (DAC) 209.

The DAC 209 includes a first control input configured to receive a first digital control signal $D_1$, a second control input configured to receive a second digital control signal $D_2$, a first differential output configured to generate an assert decision threshold voltage 211a, 211b, and a second differential output configured to generate a de-assert decision threshold voltage 212a, 212b. The first small signal boost circuit 201a includes a differential input electrically connected to the differential input terminal 1a, 1b. The second small signal boost circuit 201b includes a differential input electrically connected to the first differential output of the DAC 209, and the third small signal boost circuit 201c includes a differential input electrically connected to the second differential output of the DAC 209. The first to third rectifiers 202a-202c each include a differential input electrically connected to a differential output of the first to third small signal boost circuits 201a-201c, respectively. The first to third rectifiers 202a-202c each further include a differential output electrically connected to a differential input of the first to third low-pass filters 203a-203c, respectively. The first comparator 204a includes a first differential input electrically connected to a differential output of the first low-pass filter 203a, and a second differential input electrically connected to a differential output of the second low-pass filter 203b. The second comparator 204b includes a first differential input electrically connected to the differential output of the first low-pass filter 203a, and a second differential output electrically connected to a differential output of the third low-pass filter 203c. The multiplexer 206 includes a first differential input electrically connected to a differential output of the first comparator 204a and a second differential input electrically connected to a differential output of the second comparator 204b. The multiplexer 206 further includes an output electrically connected to a control input of the multiplexer 206 and to a differential input of the differential to single-ended converter 207. The differential to single-ended converter 207 further includes an output electrically connected to an input of the counter 208. The counter 208 further includes a control input configured to receive the third digital signal $D_3$ and an output configured to generate the detection signal LOS.

The illustrated loss of signal detection system 200 operates using feedback. For example, when the first input of the multiplexer 206 is selected, the state of the multiplexer 206 can be maintained until the first comparator 204a determines that the differential input signal is less than the assert decision threshold voltage 211a, 211b. Once the first comparator 204a determines that the differential input signal is less than the assert decision threshold voltage, the state of the multiplexer 206 can change to select the multiplexer's second input. The multiplexer 206 can remain in this state until the second comparator 204b determines that the differential input signal is greater than the de-assert decision threshold voltage 212a, 212b. By configuring the assert decision threshold voltage 211a, 211b to have a voltage that is less than that of the de-assert decision threshold voltage 212a, 212b, the loss of signal detection system 200 can be configured to operate with hysteresis. Additionally, since the feedback loop of the loss of signal detection system 200 is relatively short, the loss of signal detection system 200 can be configured to operate with high speed.

The loss of signal detection system 200 generates the detection signal LOS based on a comparison of the input voltage to both the assert decision threshold voltage 211a, 211b and to the de-assert decision threshold voltage 212a, 212b. Configuring the loss of signal detection system 200 in this manner can enhance the system's performance. For example, when only a single decision threshold voltage is used to generate a detection signal, noise in the input signal can cause the loss of signal detection signal to regularly change or chatter when the input signal is relatively close in magnitude to the decision threshold voltage.

As shown in FIG. 9, the loss of signal detection circuit 200 includes a small signal boost circuit, a rectifier circuit, and a low-pass filter for processing not only the differential input signal received on the differential input terminal 1a, 1b, but also for processing the assert decision threshold voltage 211a, 211b and for processing the de-assert decision threshold voltage 212a, 212b. Configuring the loss of signal detection system 200 in this manner can enhance the robustness of the system against common-mode noise and/or systematic offset.

In the illustrated configuration, the DAC 209 can be configured to generate the assert decision threshold voltage 211a, 211b and the de-assert decision threshold voltage 212a, 212b based on first and second digital control signals $D_1$, $D_2$, respectively. Configuring the DAC 209 in this manner can enhance the flexibility of the loss of signal detection system 200 by permitting the assert decision threshold voltage 211a, 211b and the de-assert decision threshold voltage 212a, 212b to be tuned for a specific application or operating condition.

The illustrated configuration further includes a counter 208 configured to receive the third digital signal $D_3$. The counter 208 can be used to count a number of times the output of the differential to single-ended converter 207 (and also the output of the multiplexer 206) has had a particular state, and can generate the detection signal LOS based on the result. For example, in certain implementations, the counter 208 can be used to maintain the state of the detection signal LOS until the counter 208 determines that the output of multiplexer 206 has had a constant state at least for a period of time indicated by a count value provided using the third digital signal $D_3$.

The counter 208 can provide enhanced flexibility for achieving a desired trade-off between detection speed and accuracy. For example, in certain implementations, the first to third low pass filters 203a-203c can be configured to provide a relatively small amount of filtering, thereby permitting the loss of signal detection system 200 to have a relatively fast detection speed. To increase the loss of signal detection system's accuracy to a level sufficient for certain applications, the count value of the counter 208 can be selected to have a relative large value. Thus, a precision and speed of the loss of signal detection system 200 can be adjusted using the third digital signal $D_3$.

The illustrated configured includes the differential to single-ended converter 207 for converting the differential output of the multiplexer 206 to a single-ended signal for the counter 208. In certain implementations, the differential to single-ended converter 207 is a current-mode logic (CML) to complementary metal oxide semiconductor (CMOS) converter. Configuring the loss of signal detection system 200 to operate in part using CML logic can aid the loss of signal detection system 200 in operating with very high speed. However, other configurations are possible, including, for example, configurations in which the differential to single-ended converter 207 is arranged in other ways. For example, the loss of signal detection system 200 can be configured to provide differential to single-ended conversion at other locations in a detection signal path, including, for example, before or after the multiplexer 206.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, loss of signal detectors can be used in networks systems, such as in crosspoint switches. The loss of signal detectors can also be used in wireless infrastructure for cellular base stations and/or in circuits for radio links, receiver mixer chains, digital predistortion transmitter observation receivers, and/or other RF applications. Examples of the electronic devices can also include consumer electronic products, parts of the consumer electronic products, electronic test equipment, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a detection circuit configured to monitor a differential input, wherein the detection circuit comprises:
a first small signal boost circuit operatively coupled to the differential input and configured to generate a differential amplified signal by amplifying the differential input, wherein the first small signal boost circuit is configured to provide at least a first amount of gain when an input signal level of the differential input is in a small signal input region, and to reduce gain from the first gain amount without external gain control adjustment when the input signal level is outside of the small signal input region;
a first rectifier circuit configured to rectify the differential amplified signal to generate a rectified signal, wherein the first rectifier circuit has a low gain in the small signal input region and a higher gain outside of the small signal input region, wherein the first small signal boost circuit is further configured to compensate for the low gain of the first rectifier circuit in the small signal input region to widen a linear range of the first rectifier circuit into the small signal input region, wherein the combination of the first small signal boost circuit and the first rectifier circuit provides amplification to the differential input both when the input signal level is in the small signal input region and when the input signal level is outside of the small signal input region;
a first low-pass filter configured to filter the rectified signal to generate a filtered signal; and
one or more comparators configured to evaluate the filtered signal to determine a presence or absence of a differential input signal at the differential input.

2. The apparatus of claim 1, wherein the one or more comparators comprises:
a first comparator including a first input configured to receive the filtered signal and a second input configured to receive an assert decision threshold voltage; and
a second comparator including a first input configured to receive the filtered signal and a second input configured to receive a de-assert decision threshold voltage, wherein the assert decision threshold voltage is less than the de-assert decision threshold voltage.

3. The apparatus of claim 2, wherein the detection circuit further comprises:
a multiplexer including a first input electrically connected to an output of the first comparator, a second input electrically connected to an output of the second comparator, a control input, and an output electrically connected to the control input; and
a counter, wherein the counter is configured to count a number of sequential occurrences in a state of the output of the multiplexer, and to generate a detection signal based on the result.

4. The apparatus of claim 3, wherein the counter includes a digitally configurable count value.

5. The apparatus of claim 2, wherein the detection circuit further comprises:
a digital to analog converter (DAC);
a second small signal boost circuit;
a second rectifier circuit;
a second low-pass filter, wherein the second small signal boost circuit, the second rectifier circuit, and the second low-pass filter are connected in a first electrical path between a first output of the DAC and the second input of the first comparator;
a third small signal boost circuit;
a third rectifier circuit; and
a third low-pass filter, wherein the third small signal boost circuit, the third rectifier circuit, and the third low-pass filter are connected in a second electrical path between a second output of the DAC and the second input of the second comparator,
wherein the DAC is configured to control a voltage level of the assert decision threshold voltage based on a first digital control signal, and wherein the DAC is further configured to control a voltage level of the de-assert decision threshold voltage based on a second digital control signal.

6. The apparatus of claim 1, further comprising a first receive circuit operatively coupled to the differential input, wherein the detector circuit is configured to selectively disable at least the first receive circuit based on the presence or absence of the differential input signal at the differential input.

7. The apparatus of claim 6, further comprising:
a crosspoint switch core circuit including a plurality of crosspoint inputs and a plurality of crosspoint outputs, wherein the crosspoint core circuit is configured to route one or more signals received at the plurality of crosspoint inputs to one or more of the plurality of crosspoint outputs; and
a plurality of receive circuits electrically connected to the plurality of crosspoint inputs, wherein the plurality of receive circuits includes the first receive circuit, a second receive circuit, and a third receive circuit, wherein a first crosspoint input of the plurality of crosspoint inputs is electrically connected to an output of the first receive circuit, wherein a second crosspoint input of the plurality of crosspoint inputs is electrically connected to an output of the second receive circuit, and wherein a third crosspoint input of the plurality of crosspoint inputs is electrically connected to an output of the third receive circuit.

8. The apparatus of claim 7, further comprising:
a plurality of transmit circuits electrically connected to the plurality of crosspoint outputs,
wherein the crosspoint switch core circuit is configured to route a signal received from the first receive circuit to one or more selected transmit circuits of the plurality of transmit circuits, and wherein the detector circuit is further configured to selectively disable the one or more selected transmit circuits based on the presence or absence of the differential input signal at the differential input.

9. The apparatus of claim 1, further comprising a linear gain circuit that operates in parallel with the small signal boost circuit.

10. The apparatus of claim 1, wherein the first small signal boost circuit provides more gain when a voltage magnitude of the differential input signal is less than about 20 mV relative to when a voltage magnitude of the differential input signal is greater than about 60 mV.

11. The apparatus of claim 1, wherein the small signal boost circuit comprises a first metal oxide semiconductor (MOS) transistor and a second MOS transistor configured to boost the differential input signal, wherein a gate of the first MOS transistor is connected to a drain of the second MOS transistor, and wherein a gate of the second MOS transistor is connected to a drain of the first MOS transistor.

12. The apparatus of claim 1, wherein the small signal boost circuit comprises a first bipolar transistor and a second bipolar transistor configured to boost the differential input signal, wherein a base of the first bipolar transistor is connected to a collector of the second bipolar transistor, and wherein a base of the second bipolar transistor is connected to a collector of the first bipolar transistor.

13. An electronically-implemented method of loss of signal detection, the method comprising:
generating a first differential signal by amplifying a voltage difference between a first input terminal and a second input terminal using a small signal gain circuit, wherein generating the first differential signal comprises providing at least a first amount of gain when a magnitude of the voltage difference is less than a first level, and providing attenuation without external gain control adjustment when the magnitude of the voltage difference is greater than a second level, wherein the second level is greater than the first level;
generating a second differential signal by amplifying the voltage difference using a linear gain circuit that is electrically connected in parallel with the small signal gain circuit, wherein generating the second differential signal comprises providing substantially constant gain for input levels in an input range extending at least between the first and second levels;
generating a third differential signal indicative of the sum of the first differential signal and the second differential signal;
rectifying the third differential signal to generate a rectified signal using a rectifier circuit;
filtering the rectified signal to generate a filtered signal using a low-pass filter; and
determining a presence or absence of a differential input signal between the first and second input terminals by evaluating the filtered signal using one or more comparators.

14. The method of claim 13, wherein evaluating the filtered signal using one or more comparators comprises:
comparing the filtered signal to an assert decision threshold voltage using a first comparator; and
comparing the filtered signal to a de-assert decision threshold voltage using a second comparator, wherein the assert decision threshold voltage is less than the de-assert decision threshold voltage.

15. The method of claim 13, further comprising a first receive circuit operatively coupled to the first input terminal and the second input terminal, wherein the method further includes selectively disabling at least the first receive circuit based on the presence or absence of the differential input signal between the first and second input terminals.

16. The method of claim 13, further comprising using the small signal gain circuit to compensate for a low gain of the rectifier circuit for input signal levels smaller than the first level to widen a linear range of the rectifier circuit.

17. An apparatus comprising:
a detection circuit configured to monitor a differential input, wherein the detection circuit comprises:
a small signal gain circuit operatively coupled to the differential input and configured to generate a first differential signal by amplifying the differential input, wherein the small signal gain circuit is configured to provide at least a first amount of gain for input signal levels smaller than a first level, wherein the small signal boost circuit is configured to provide attenuation without external gain control for input levels higher than a second level, wherein the second level is higher than the first level;
a linear gain circuit operatively coupled to the differential input and electrically connected in parallel with the small signal gain circuit, wherein the linear gain circuit has an input range extending at least between the first and second levels, and wherein the linear gain circuit is configured to generate a second differential signal by providing substantially constant gain to the differential input for input levels in the input range;
a rectifier circuit configured to receive a third differential signal indicative of the sum of the first differential signal and the second differential signal, wherein the rectifier circuit is configured to rectify the third signal to generate a rectified signal;
a first low-pass filter configured to filter the rectified signal to generate a filtered signal; and
one or more comparators configured to evaluate the filtered signal to determine a presence or absence of a differential input signal at the differential input.

18. The apparatus of claim 17, wherein the small signal gain circuit comprises:
a first bipolar transistor having an emitter, a base, and a collector;
a second bipolar transistor having an emitter, a base, and a collector, wherein the emitter of the second bipolar transistor is electrically connected to the emitter of the first bipolar transistor; and
a current source configured to provide a bias current to the emitters of the first and second bipolar transistors,
wherein the small signal gain circuit is configured to receive the differential input signal between the base of the first bipolar transistor and the base of the second bipolar transistor, and wherein the small signal gain circuit is further configured to generate the first differential signal between the collector of the first bipolar transistor and the collector of the second bipolar transistor.

19. The apparatus of claim 17, wherein the small signal gain circuit comprises:
a first metal oxide semiconductor (MOS) transistor having a source, a gate, and a drain;
a second MOS transistor having a source, a gate, and a drain, wherein the source of the second MOS transistor is electrically connected to the source of the first MOS transistor; and
a current source configured to provide a bias current to the sources of the first and second MOS transistors,
wherein the small signal gain circuit is configured to receive the differential input signal between the gate of the first MOS transistor and the gate of the second MOS transistor, and wherein the small signal gain circuit is further configured to generate the first differential signal between the drain of the first MOS transistor and the drain of the second MOS transistor.

20. The apparatus of claim 17, further comprising a buffer circuit including an input and an output, wherein the input of the buffer circuit is electrically connected both to an output of the linear gain circuit and to an output of the small signal gain circuit, and wherein the output of the buffer circuit is configured to generate the third differential signal for the rectifier circuit.

21. The apparatus of claim 17, wherein the linear gain circuit comprises:
a first bipolar transistor having an emitter, a base, and a collector;
a second bipolar transistor having an emitter, a base, and a collector, wherein the linear gain circuit is configured to receive the differential input signal between the base of the first bipolar transistor and the base of the second bipolar transistor, and wherein the linear gain circuit is configured to generate the second signal between the collector of the first bipolar transistor and the collector of the second bipolar transistor;
a first current source configured to provide a first bias current to the emitter of the first bipolar transistor;
a second current source configured to provide a second bias current to the emitter of the second bipolar transistor; and
a resistor electrically connected between the emitter of the first bipolar transistor and the emitter of the second bipolar transistor.

22. The apparatus of claim 17, wherein the linear gain circuit comprises:
a first MOS transistor having a source, a gate, and a drain;
a second MOS transistor having a source, a gate, and a drain, wherein the linear gain circuit is configured to receive the differential input signal between the gate of the first MOS transistor and the gate of the second MOS transistor, and wherein the linear gain circuit is configured to generate the second signal between the drain of the first MOS transistor and the drain of the second MOS transistor;
a first current source configured to provide a first bias current to the source of the first MOS transistor;
a second current source configured to provide a second bias current to the source of the second MOS transistor; and
a resistor electrically connected between the source of the first MOS transistor and the source of the second MOS transistor.

23. The apparatus of claim 17, further comprising a first receive circuit operatively coupled to the differential input, wherein the detector circuit is configured to selectively disable at least the first receive circuit based on the presence or absence of the differential input signal at the differential input.

24. The apparatus of claim 23, further comprising:
a crosspoint switch core circuit including a plurality of crosspoint inputs and a plurality of crosspoint outputs, wherein the crosspoint core circuit is configured to route one or more signals received at the plurality of crosspoint inputs to one or more of the plurality of crosspoint outputs; and
a plurality of receive circuits electrically connected to the plurality of crosspoint inputs, wherein the plurality of receive circuits includes the first receive circuit, a second receive circuit, and a third receive circuit, wherein a first crosspoint input of the plurality of crosspoint inputs is electrically connected to an output of the first receive circuit, wherein a second crosspoint input of the plurality of crosspoint inputs is electrically connected to an output of the second receive circuit, and wherein a third crosspoint input of the plurality of crosspoint inputs is electrically connected to an output of the third receive circuit.

25. The apparatus of claim 24, further comprising:
a plurality of transmit circuits electrically connected to the plurality of crosspoint outputs,
wherein the crosspoint switch core circuit is configured to route a signal received from the first receive circuit to one or more selected transmit circuits of the plurality of transmit circuits, and wherein the detector circuit is further configured to selectively disable the one or more selected transmit circuits based on the presence or absence of the differential input signal at the differential input.

* * * * *